(12) United States Patent
Lee et al.

(10) Patent No.: US 8,247,966 B2
(45) Date of Patent: Aug. 21, 2012

(54) ORGANIC LIGHT EMITTING DEVICE

(75) Inventors: Jae Yoon Lee, Seoul (KR); Ock Hee Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 442 days.

(21) Appl. No.: 11/476,082

(22) Filed: Jun. 28, 2006

(65) Prior Publication Data
US 2007/0001584 A1    Jan. 4, 2007

(30) Foreign Application Priority Data

Jun. 30, 2005  (KR) .................. 10-2005-0058185

(51) Int. Cl.
*H01L 51/00* (2006.01)
*H01L 51/52* (2006.01)

(52) U.S. Cl. ................................ 313/506; 313/500
(58) Field of Classification Search ........... 313/498–512
See application file for complete search history.

(56) References Cited

U.S. PATENT DOCUMENTS

| 6,366,025 | B1* | 4/2002 | Yamada ................ 315/169.3 |
| 6,747,618 | B2* | 6/2004 | Arnold et al. ............... 345/77 |
| 6,867,549 | B2 | 3/2005 | Cok et al. |
| 7,129,634 | B2* | 10/2006 | Boroson et al. ............ 313/504 |
| 7,187,118 | B2 | 3/2007 | Park et al. |
| 7,205,713 | B2 | 4/2007 | Kiguchi |
| 2002/0050786 | A1* | 5/2002 | Yamazaki et al. .......... 313/504 |
| 2004/0021423 | A1* | 2/2004 | Jongman et al. .......... 315/169.1 |
| 2004/0113875 | A1* | 6/2004 | Miller et al. ................. 345/82 |
| 2005/0151462 | A1* | 7/2005 | Miyagawa ................. 313/500 |
| 2005/0173700 | A1* | 8/2005 | Liao et al. .................... 257/40 |

FOREIGN PATENT DOCUMENTS

| CN | 1499909 A | 5/2004 |
| CN | 1550846 A | 12/2004 |

OTHER PUBLICATIONS

Machine translation of JP 06-102503 provided.*

* cited by examiner

*Primary Examiner* — Anh Mai
*Assistant Examiner* — Zachary J Snyder
(74) *Attorney, Agent, or Firm* — Birch, Stewart, Kolasch & Birch, LLP

(57) ABSTRACT

An organic light emitting device, which includes a first substrate, scan lines and data lines arranged on the first substrate, and at least an unit pixel comprising a R sub-pixel corresponding to a Red color, a G sub-pixel corresponding to a Green color, and a B sub-pixel corresponding to a Blue color positioned in a region on the first substrate defined by a crossing of the scan and data lines.

18 Claims, 7 Drawing Sheets

ORGANIC LIGHT EMITTING DEVICE

CROSS-REFERENCE TO RELATED APPLICATION

This application claims priority to and the benefit of Korean Patent Application No. 10-2005-0058185, filed on Jun. 30, 2005, the entire contents of which is incorporated herein by reference.

BACKGROUND OF THE INVENTION

1. Field of the Invention

The present invention relates to an Organic Light Emitting Device (OLED).

2. Description of the Related Art

An OLED is a self-light emitting device which emits light by rejoining electrons with holes in a light emitting layer. An OLED is fabricated as a thin film and has a quick reaction rate and low driving voltage compared to a passive device such as a liquid crystal display (LCD), which requires an additional light source. Thus, the OLED is used in wall-mounted television (TV) sets or portable TVs. Further, the OLED includes a pixel circuit unit having sub-pixels of Red (R), Green (G) and Blue (B) colors to realize a full color display.

In more detail, FIG. 1 illustrates a related active matrix-type OLED 100. As shown, the related art active matrix-type OLED 100 includes a pixel circuit unit 110 for displaying an image, and a data driver 120 and a scan driver 130 for supplying electrical signals to the pixel circuit unit 110.

The data driver 120 supplies data signals to R, G and B sub-pixels 170 of the pixel circuit unit 110 through data lines 140. Further, the scan driver 130 supplies scan signals or selection signals to the R, G and B sub-pixels 170 through scan lines 150. A controller (not shown) supplies R, G and B control signals and scan control signals to the data driver 120 and the scan driver 130, respectively, to control the data driver 120 and the scan driver 130.

The pixel circuit unit 110 also includes a plurality of unit pixels 160. As shown, each unit pixel 160 includes R, G and B sub-pixels 170 positioned in a region defined by the crossing of the data lines 140 and the scan lines 150, respectively and each sub-pixel 170 includes a first electrode, a second electrode, and an organic light emitting layer formed between the first and the second electrodes. The color of each sub-pixel is determined by the organic light emitting layer.

In addition, when electrical signals are supplied to the R, G and B sub-pixels 170 through the data lines 140 and the scan lines 150, the R, G and B sub-pixels 170 emit light having a brightness corresponding to the electrical signals to thereby form a predetermined image in the pixel circuit unit 110.

Turning next to FIG. 2, which is a plane view of a unit pixel showing how sub-pixels are arranged in the related art OLED. FIG. 1 will also be referred to in this description. As shown in FIGS. 1 and 2, each unit pixel 160 includes the R, G and B sub-pixels 170 of a same size in the ratio of 1:1:1 in the horizontal or vertical direction. However, the R, G and B sub-pixels 170 have a different luminous efficiency and life-time expectancy according to materials that form the R, G and B organic light emitting layer. For example, a brightness ratio of the R, G and B sub-pixels is 2.5:5:1 when the white balance follows the National Television System Committee (NTSC), i.e., 0.310 and 0.3130.

Therefore, when the luminous efficiency ratio of the R, G and B sub-pixels 170 is the same as the brightness ratio, the driving current is supplied to each sub-pixel in the same ratio as the brightness ratio. However, the luminous efficiency of the related art R, G and B sub-pixels is different from the brightness ratio, which is used for adjusting the white balance. Thus, when the luminous efficiency ratio of the R, G and B sub-pixels is 1:4:1.5, the ratio of the driving current of R, G and B sub-pixels is approximately 4:2:1.

In addition, the R, G and B sub-pixels are connected to thin film transistors supplied with a driving current. As described above, the driving current of the R, G and B sub-pixels is different, and therefore the performance of the thin film transistor is based on the sub-pixels of the one color that requires the highest driving current among the R, G and B sub-pixels. Further, the more difference between the driving current of the R, G and B sub-pixels is, the more difficult it is to set up a range of an exact R, G and B independent operation. Moreover, even though the same or lower driving current of sub-pixels for one color is required, the life-time expectancy of the sub-pixels for the one color may be shorter than the other colors due to a reliability problem of the sub-pixels themselves.

In addition, because the related art OLED 100 described above has the R, G and B sub-pixels in the ratio of 1:1:1, the driving current applied to each sub-pixel to emit the requested brightness of each color to realize a white balance is determined according to color coordinates and luminous efficiency. Accordingly, the driving current applied to the sub-pixels of a color with a shorter life-time expectancy than those of the other colors cannot be reduced. This disadvantageously affects the life-time expectancy of the pixel circuit unit 110.

SUMMARY OF THE INVENTION

Accordingly, one object of the present invention is to provide an OLED with an improved life-time expectancy and color mixture.

To achieve this and other objects, the present invention provides in one aspect an organic light emitting device, which includes a first substrate, scan lines and data lines arranged on the first substrate, and at least an unit pixel comprising a R sub-pixel corresponding to a Red color, a G sub-pixel corresponding to a Green color, and a B sub-pixel corresponding to a Blue color positioned in a region on the first substrate defined by a crossing of the scan and data lines, wherein a number of at least one of the R, G, and B sub-pixels is different than a number of the other sub-pixels.

In another aspect, the present invention provides a method of fabricating an organic light emitting device. The method includes forming scan lines and data lines on a first substrate, and forming at least an unit pixel comprising a R sub-pixel corresponding to a Red color, a G sub-pixel corresponding to a Green color, and a B sub-pixel corresponding to a Blue color positioned in a region on the first substrate defined by a crossing of the scan and data lines, wherein a number of at least one of the R, G, and B sub-pixels is different than a number of the other sub-pixels.

Further scope of applicability of the present invention will become apparent from the detailed description given hereinafter. However, it should be understood that the detailed description and specific examples, while indicating embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION

Reference will now be made in detail to the embodiments of the present invention, examples of which are illustrated in the accompanying drawings.

Figure 1:
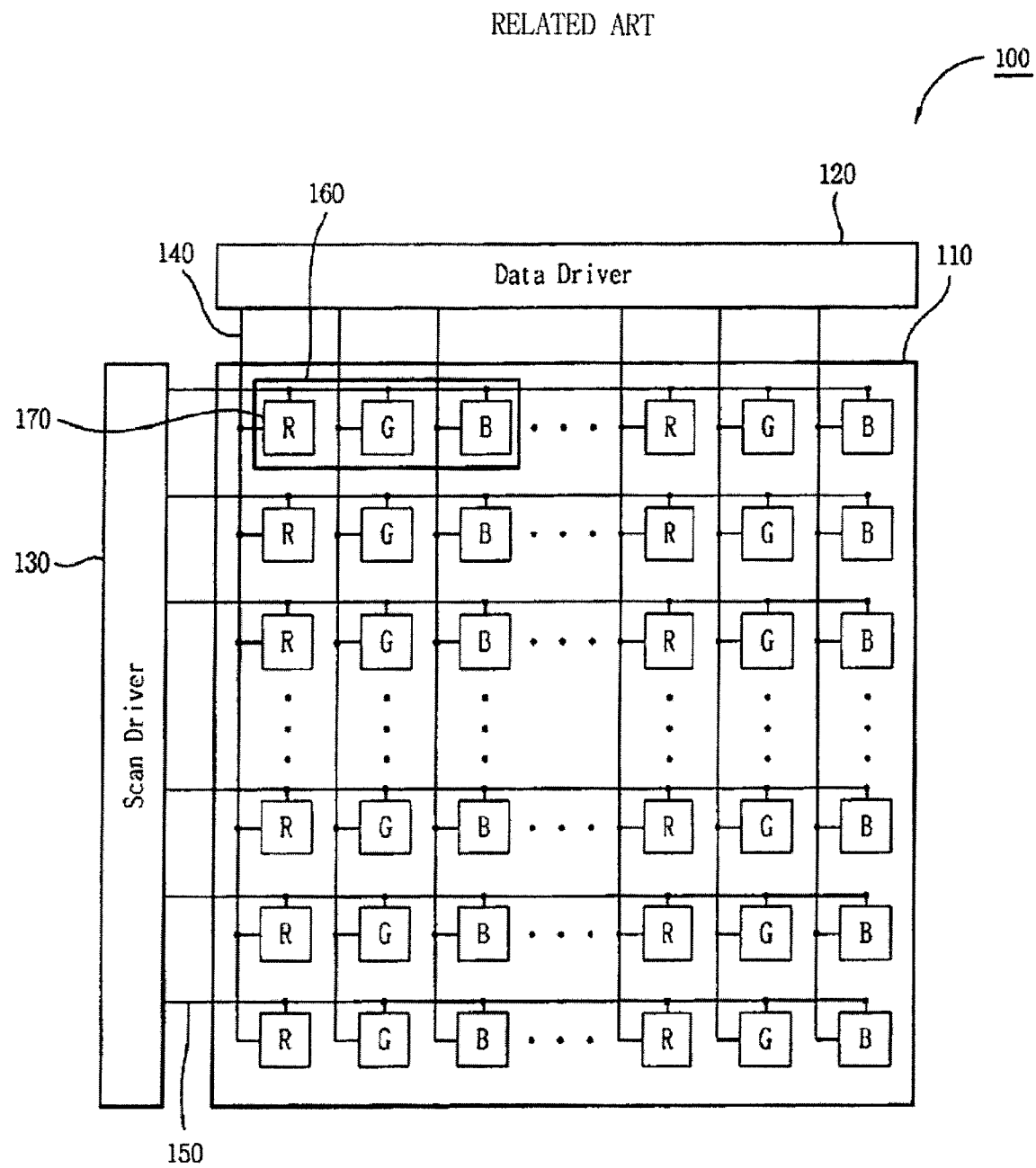
FIG. 1 is an overview illustrating a related art OLED.
Figure 2:
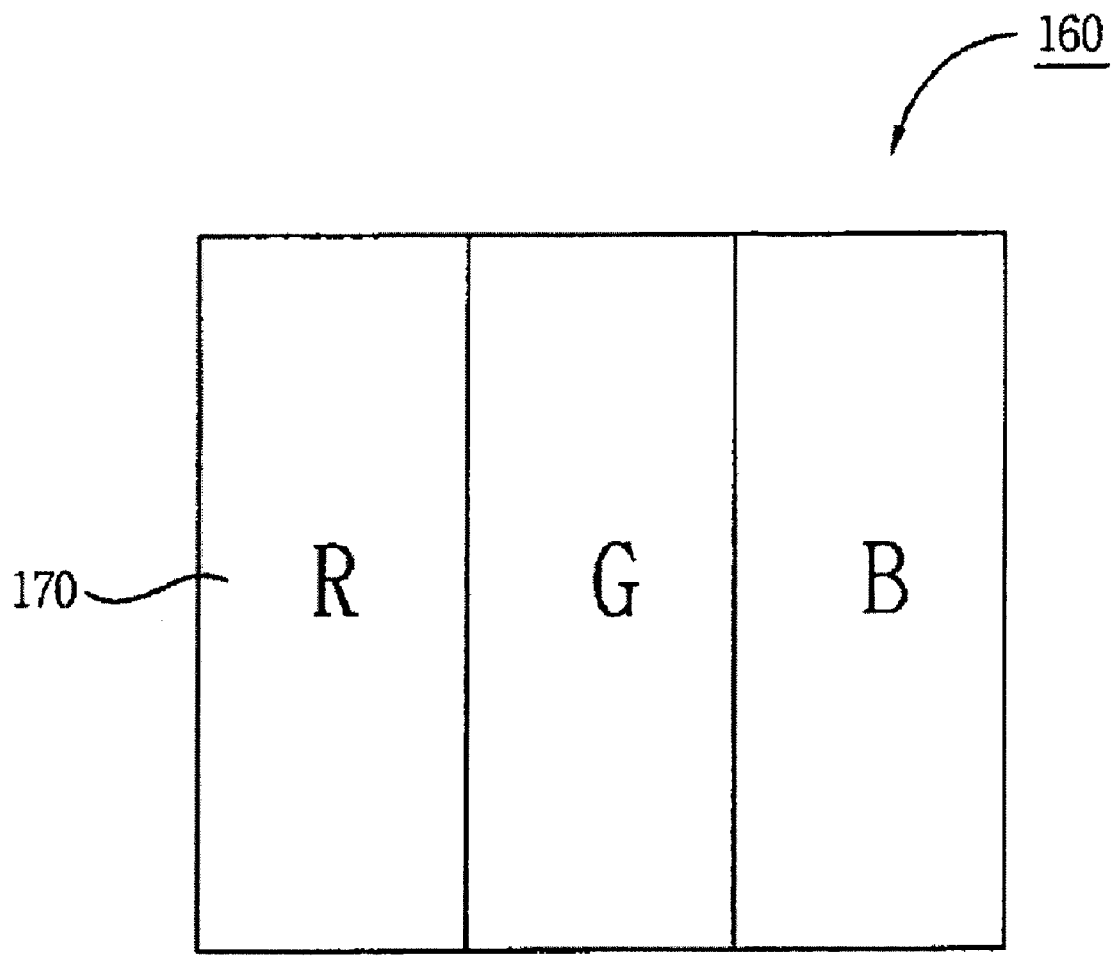
FIG. 2 is a plane view of a unit pixel showing how sub-pixels are arranged in the related art OLED.
Figure 3:
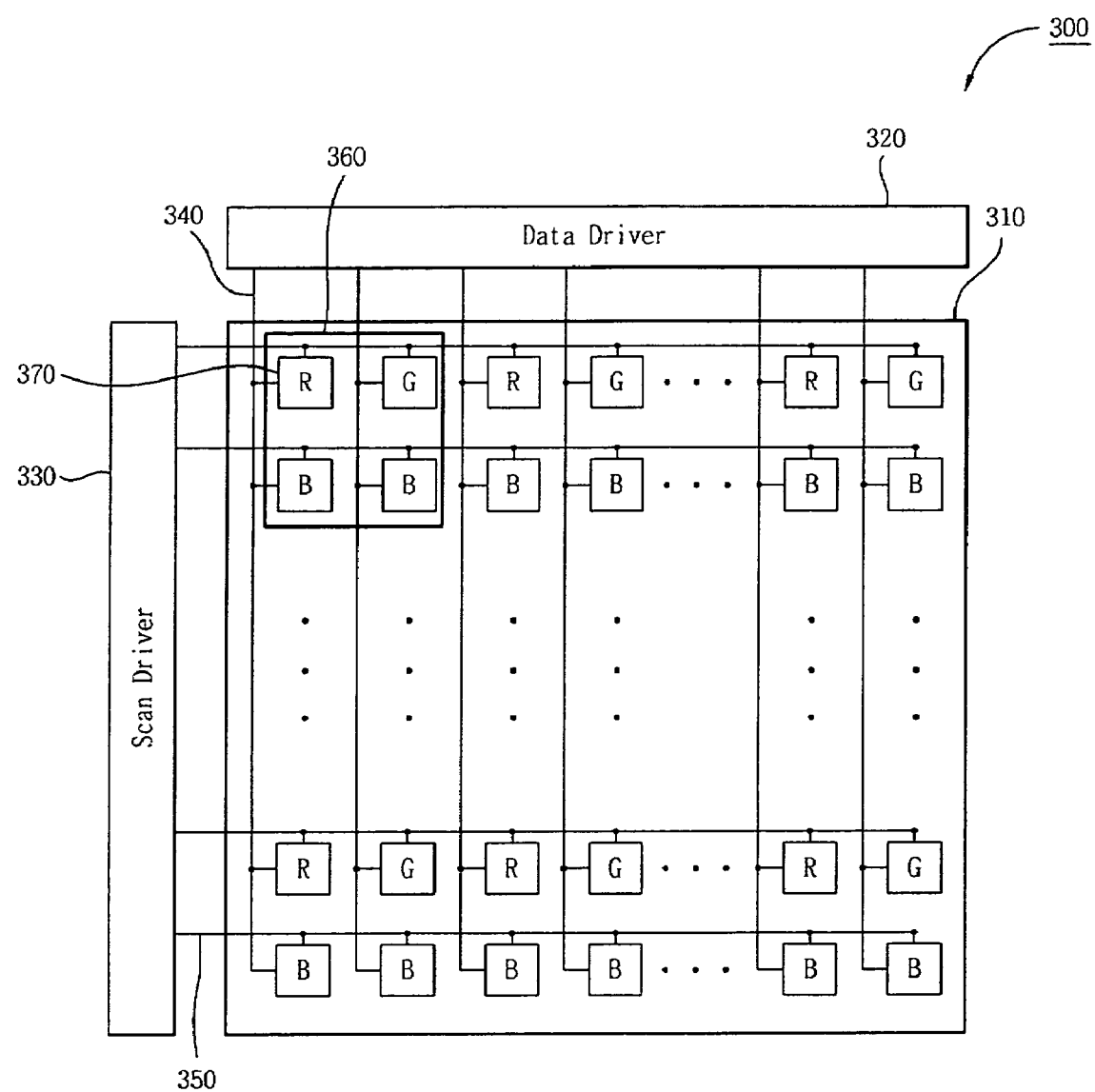
FIG. 3 is an overview illustrating an OLED in accordance with an embodiment of the present invention.

Turning first to FIG. 3, which is an overview illustrating an OLED 300 in accordance with an embodiment of the present invention. As shown, the OLED 300 includes a pixel circuit unit 310 for displaying an image, and a data driver 320 and a scan driver 330 which supply electrical signals to the pixel circuit unit 310.

Further, the data driver 320 supplies data signals to R, G and B sub-pixels 370 of the pixel circuit unit 310 through data lines 340, and the scan driver 330 supplies scan signals or selection signals to the R, G and B sub-pixels 370 of the pixel circuit unit 310 through scan lines 350. A controller (not shown) supplies R, G and B control signals and scan control signals to the data driver 320 and the scan driver 330, respectively, to control the data driver 320 and the scan driver 330.

In addition, as shown, the pixel circuit unit 310 includes a plurality of unit pixels 360 having R, G and B sub-pixels 370. Each sub-pixel 370 is positioned in a region defined by a crossing of the data lines 340 and the scan lines 350 and includes a first electrode, a second electrode, and an organic light emitting layer formed between the first and the second electrodes. Further, the color of sub-pixel is determined according to the organic light emitting layer. Also, when electrical signals are applied to the R, G and B sub-pixels 370 through the scan lines 350 and the data lines 330, the R, G and B sub-pixels 370 emit light having a brightness corresponding to the electrical signals to thereby form a predetermined image in the pixel circuit unit 310.

Figure 4:
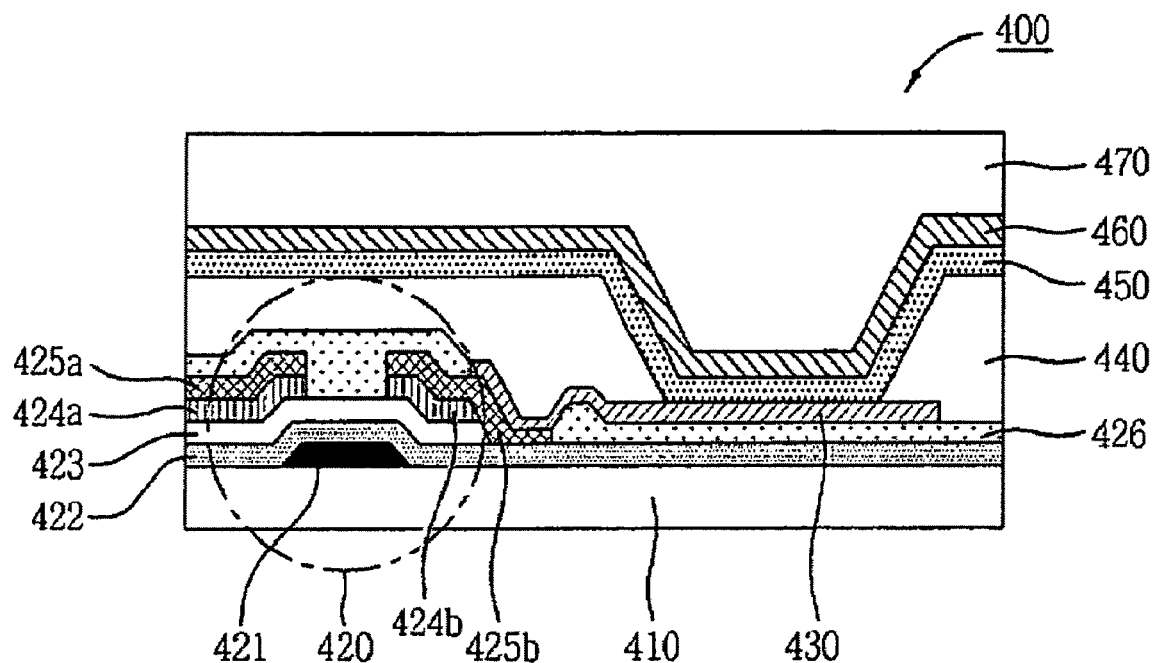
FIG. 4 is a cross-section showing a structure of sub-pixels of the OLED in accordance with the embodiment of the present invention.

Turning next to FIG. 4, which is a cross-section showing a structure of sub-pixels 400 of the OLED in accordance with the embodiment of the present invention. As shown, each R, G and B sub-pixel 400 includes a thin film transistor 420 formed on a substrate 410, and a light emitting unit connected to the thin film transistor 420. A protection layer 470 is also formed on the light emitting unit 470.

In addition, the thin film transistor 420 includes a gate electrode 421, a gate insulation layer 422, a semiconductor layer 423, source/drain regions 424a and 424b, source/drain electrodes 425a and 425b, and a passivation layer 426. Further, the light emitting unit includes a first electrode 430 electrically connected to the drain electrode 425b, an insulation film 440 having an opening exposing the portion of the first electrode 430, an R or G or B organic light emitting layer 450 stacked on the first electrode 430 exposed by the insulation film 440, and a second electrode 460 formed on the organic light emitting layer 450.

The first electrode 430 receives a predetermined voltage from the thin film transistor 420, and the second electrode 460 receives a voltage from common power source line (not shown). Therefore, holes and electrons are supplied to the organic light emitting layer 450 through the first electrode 430 and the second electrode 460, and when the holes are rejoined with the electrons, light is emitted.

Figure 5:
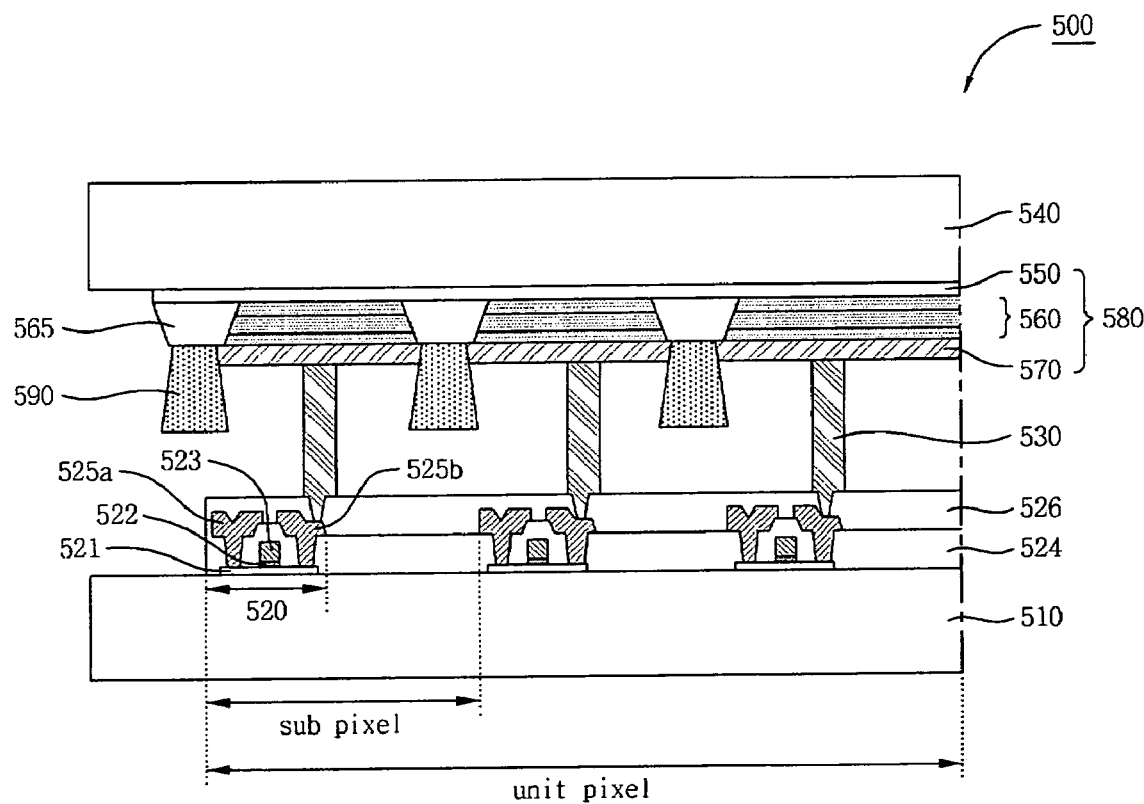
FIG. 5 is a cross-section showing another structure of sub-pixels of the OLED in accordance with the embodiment of the present invention.

Next, FIG. 5 is a cross-section showing another structure of sub-pixels 500 of the OLED shown in FIG. 3. As shown, the sub-pixels 500 include transistors 520 formed on a first substrate 510 and light emitting units 580 formed on a second substrate 540. Further, the light emitting units 580 are electrically connected to the transistors 520.

In addition, each thin film transistor 520 includes a semiconductor layer 521, a first insulation layer 522, a gate electrode 523, a second insulation layer 524, source/drain electrodes 525a and 525b, and a third insulation layer 526 exposing the portion of the source/drain electrode 525b. Further, the light emitting unit 580 includes first electrodes 570, organic light emitting layers 560, and a second electrode 550. The organic light emitting layers 560 formed on the second electrode 550 are separated by a buffered layers 565 formed on the second electrode 550 according to each sub-pixel, and the first electrodes 570 are patterned by barrier-ribs 590. The drain electrodes 525b are electrically connected to the light emitting units 580 by conductive spacers 530 when the first substrate 510 is bonded with the second substrate 540.

Figure 6:
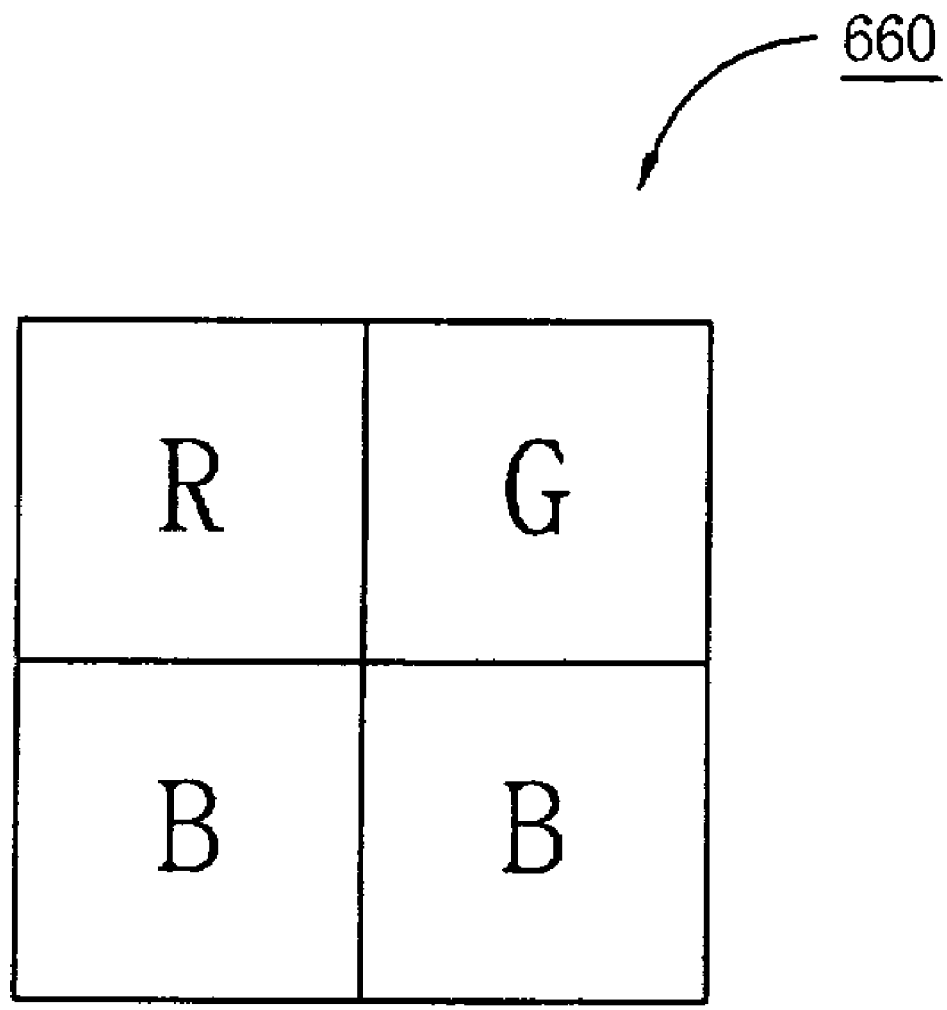
FIG. 6 is a plane view of a unit pixel showing how sub-pixels are arranged in the OLED in accordance with the embodiment of the present invention.

Turning now to FIG. 6, which is a plane view of a unit pixel 600 showing how sub-pixels are arranged in the OLED in accordance with an embodiment of the present invention. As shown, the unit pixel 660 includes one R sub-pixel, one G sub-pixel, and two B sub-pixels. The four sub-pixels are adjacent to each other and form a regular square. Further, the R, G and B sub-pixels have the same size.

Figure 7:
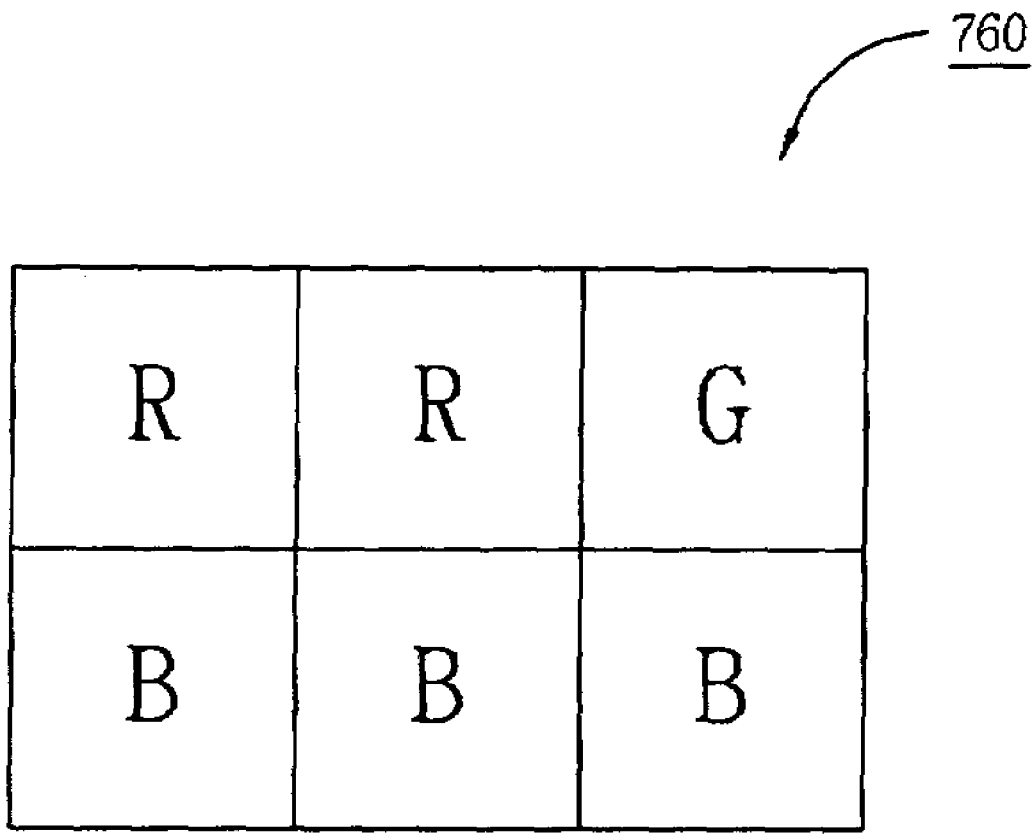
FIG. 7 is a plane view of a unit pixel showing how sub-pixels are arranged in the OLED in accordance with another embodiment of the present invention.

FIG. 7 is a plane view of a unit pixel 760 showing how sub-pixels are arranged in the OLED in accordance with another embodiment of the present invention. As shown, the unit pixel 760 includes two R sub-pixels, one G sub-pixel, and three B sub-pixels. The six R, G and B sub-pixels are adjacent to each other and form a rectangle. Further, the R, G and B sub-pixels have the same size.

Thus, with reference to FIGS. 6 and 7, the OLED of the present invention includes unit pixels 660 and 760 in which the number of sub-pixels of at least one color is selected to be different from the number of sub-pixels of the other colors among the R, G and B sub-pixels. In addition, the number of sub-pixels of each color is determined in consideration of a luminous efficiency and life-time expectancy characteristic of sub-pixels for each color.

For example, the number of sub-pixels of one color having the highest driving current value should be larger than the number of sub-pixels of the other colors to reduce the difference in the amplitude of the driving current applied to the sub-pixels. For example, when the driving current ratio of R:G:B is about 4:2:1, the number of R sub-pixels may be larger than that of the G or B sub-pixels.

Also, to increase the life-time expectancy of the OLED, the number of sub-pixels of one color having an inferior life-time expectancy characteristic is selected to be larger than the number of sub-pixels of the other colors. That is, when the number of sub-pixels of one color having an inferior life-time expectancy characteristic is larger, the driving current value applied to the each of the sub-pixels can be reduced.

For example, when the number of B sub-pixels having a worst life-time expectancy characteristic is increased to form a ratio of R:G:B=1:1:2, the brightness required for one B sub-pixel is reduced by 30%. Thus, the driving current applied to one B sub-pixel can be reduced, and accordingly the life-time expectancy of the B sub-pixels is increased.

In addition, because the ratio of R, G and B sub-pixels and the direction of the R, G and B sub-pixels differs from the related art, the method of driving the data driver is different as well. However, because the method can be easily decided by those skilled in the art, further description on the method is not provided herein.

In addition, even though the R, G and B sub-pixels are described to be arranged in the form of a regular square or rectangle in the above embodiments, other shapes such as a lozenge form may be used. Further, the R, G and B sub-pixels discussed above correspond to a thin film transistor. However, a plurality of R, G and B sub-pixels may correspond to one thin film transistor. For example, in the description with reference to FIG. 5, a plurality of sub-pixels of one color may be driven by one thin film transistor 520 by electrically connecting the first electrodes 570 of a plurality of sub-pixels to the drain electrode 525b of one thin film transistor 520 using the conductive spacers 530.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. An organic light emitting device, comprising:
a first substrate;
scan lines and data lines arranged on the first substrate;
a plurality of unit pixels, wherein each unit pixel comprises a R sub-pixel corresponding to a red color, a G sub-pixel corresponding to a green color, and a B sub-pixel corresponding to a blue color positioned in a region on the first substrate defined by a crossing of the scan and data lines, wherein a number of the R, G, and B sub-pixels is different from one another, wherein each R, G and B sub-pixel comprises a first electrode, a second electrode, and a light-emitting layer interposed between the first and second electrodes, and wherein a number of the B sub-pixels that have a shortest life-time expectancy among the R, G and B sub-pixels is larger than a number of the R and G sub-pixels; and
a driver configured to apply a driving current to the B sub-pixels, which is different than a driving current applied to the R and G sub-pixels,
wherein a plurality of the B sub-pixels is driven by a same driving thin film transistor which is connected commonly to first electrodes of the B sub-pixels by conductive spacers,
wherein the driver is further configured to apply a driving current to each of the B sub-pixels that is less than the driving current applied to the R and G sub-pixels, and
wherein the plurality of the B sub-pixels are disposed adjacent to each other and on a same side of a corresponding scan line.

2. The device as claimed in claim 1, wherein the R, G, and B sub-pixels have a same size.

3. The device as claimed in claim 1, wherein a number of sub-pixels that have a lowest luminous efficiency among the R, G and B sub-pixels is larger than a number of the other sub-pixels.

4. The device as claimed in claim 1, wherein a number of the R sub-pixels is larger than a number of the G sub-pixels, and
wherein a number of the B sub-pixels is larger than a number of the R sub-pixels.

5. The device as claimed in claim 1, further comprising:
a second substrate having the driving thin film transistor formed thereon; and
conductive spacers electrically connecting the thin film transistors and the first electrodes,
wherein the first and second substrates are sealed together.

6. A method of fabricating an organic light emitting device, said method comprising:
forming scan lines and data lines on a first substrate;
forming a plurality of unit pixels, wherein each unit pixel comprises a R sub-pixel corresponding to a red color, a G sub-pixel corresponding to a green color, and a B sub-pixel corresponding to a blue color positioned in a region on the first substrate defined by a crossing of the scan and data lines, wherein a number of the R, G, and B sub-pixels is different from one another, and wherein each R, G and B sub-pixel comprises a first electrode, a second electrode and a light-emitting layer interposed between the first and second electrodes;
forming one driving thin film transistor on a second substrate;
electrically connecting the one driving thin film transistor with the B sub-pixels,
wherein a number of the B sub-pixels that have a shortest life-time expectancy among the R, G and B sub-pixels is larger than a number of the R and G sub-pixels; and
applying a driving current to the B sub-pixels, which is different than a driving current applied to the R and G sub-pixels,
wherein a plurality of the B sub-pixels is driven by the one driving thin film transistor which is connected commonly to first electrodes of the B sub-pixels by conductive spacers,
wherein the applying step applies the driving current to each of the B sub-pixels that is less than the driving current applied to the R and G sub-pixels, and
wherein the plurality of the B sub-pixels are disposed adjacent to each other and on a same side of a corresponding scan line.

7. The method as claimed in claim 6, wherein the R, G, and B sub-pixels have a same size.

8. The method as claimed in claim 6, wherein a number of sub-pixels that have a lowest luminous efficiency among the R, G and B sub-pixels is larger than a number of the other sub-pixels.

9. The method as claimed in claim 6, wherein a number of the B sub-pixels is larger than a number of the R or G sub-pixels among the R, G and B sub-pixels.

10. The method as claimed in claim 6, further comprising:
sealing the first and second substrates together.

11. The device as claimed in claim 1, wherein the light-emitting layers of the R, G, and B sub-pixels are separated by buffer layers formed on the second electrode, and the first electrodes of the R, G, and B sub-pixels are separated by barrier ribs formed on the buffer layers, respectively.

12. The method as claimed in claim 6, wherein the light-emitting layers of the R, G, and B sub-pixels are separated by buffer layers formed on the second electrode, and the first electrodes of the R, G, and B sub-pixels are separated by barrier ribs formed on the buffer layers, respectively.

13. The device as claimed in claim 1, wherein the number of B sub-pixels in a single unit pixel is two and the number of R and G sub-pixels is one each.

14. The device as claimed in claim 13, wherein the R, G and B-sub-pixels are disposed in a square shape with the two B sub-pixels being on a lower row and the R and G sub-pixels being on an upper row.

15. The method as claimed in claim 6, wherein the number of B sub-pixels in a single unit pixel is three, the number of R sub-pixels is two and the number of G sub-pixels is one.

16. The method as claimed in claim 15, wherein the R, G and B-sub-pixels are disposed in a rectangular shape with the three B sub-pixels being on a lower row, and the two R sub-pixels and the one G sub-pixel being on an upper row.

17. The device as claimed in claim 6, wherein the number of B sub-pixels in a single unit pixel is three, the number of R sub-pixels is two and the number of G sub-pixels is one.

18. The device as claimed in claim 17, wherein the R, G and B-sub-pixels are disposed in a rectangular shape with the three B sub-pixels being on a lower row, and the two R sub-pixels and the one G sub-pixel being on an upper row.

* * * * *